(12) United States Patent
Mar

(10) Patent No.: US 8,543,628 B2
(45) Date of Patent: Sep. 24, 2013

(54) METHOD AND SYSTEM OF DIGITAL SIGNAL PROCESSING

(75) Inventor: Monte Mar, Issaquah, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 1218 days.

(21) Appl. No.: 12/238,893

(22) Filed: Sep. 26, 2008

(65) Prior Publication Data

US 2009/0024828 A1    Jan. 22, 2009

Related U.S. Application Data

(63) Continuation-in-part of application No. 11/865,672, filed on Oct. 1, 2007, now Pat. No. 8,092,083.

(60) Provisional application No. 60/912,399, filed on Apr. 17, 2007.

(51) Int. Cl.
*G06F 17/10* (2006.01)
(52) U.S. Cl.
USPC .......................................... 708/300; 711/217
(58) Field of Classification Search
None
See application file for complete search history.

(56) References Cited

U.S. PATENT DOCUMENTS

| 7,107,302 | B1* | 9/2006 | Fridman et al. | 708/319 |
| 7,908,306 | B1* | 3/2011 | Chieng et al. | 708/300 |
| 2005/0283509 | A1* | 12/2005 | Hennedy et al. | 708/300 |
| 2006/0195498 | A1* | 8/2006 | Dobbek et al. | 708/300 |

OTHER PUBLICATIONS

K. Azim and R.W. Brodersen; "A Custom DSP Chip to Implement a Robot Motion Controller Proceedings of the IEEE Custom Integrated Circuits Conference"; May 1988; p. 8.7.1-8.7.5.
F. Catthoor et al.; "Architectural Strategies for an Application-Specific Synchronous Multiprocessor Environment"; IEEE transactions on Acoustics, Speech, and Signal Processing; vol. 36, No. 2, Feb. 1988; pp. 265-284.

* cited by examiner

*Primary Examiner* — Michael D Yaary

(57) ABSTRACT

A system comprises a system interface to receive one or more instruction sets from a microcontroller and to receive digital data to be processed. The system further comprises a controller that is reconfigurable according to the one or more instruction sets received by the system interface. The system further comprises a data path device to perform digital filtering operations on the digital data as directed by the controller according to the reconfiguration of the controller by the one or more instruction sets.

18 Claims, 5 Drawing Sheets

METHOD AND SYSTEM OF DIGITAL SIGNAL PROCESSING

RELATED APPLICATIONS

This application is a continuation-in-part of co-pending U.S. application Ser. No. 11/865,672, filed Oct. 1, 2007, filed, which claims the benefit of U.S. Provisional Application No. 60/912,399, filed Apr. 17, 2007, both of which are incorporated herein by reference.

TECHNICAL FIELD

This disclosure relates generally to electronic circuits, and more particularly to processors for filtering of digital signals.

BACKGROUND

Digital filtering is a commonly used application of digital signal processing that can remove unwanted parts of a digital signal, such as random noise and interfering signals, or extract useful parts of the digital signal, such as the components lying within a certain frequency range. This is typically accomplished by mapping a digital filter algorithm to a processor that computes the algorithm. Many electronic communication systems, such as radios, cell phones, and stereo receivers, include technology that can perform digital filtering. These electronic communication systems typically implement one or more digital filters, such as Finite Impulse Response (FIR) filtering or Infinite Impulse Response (IIR) filtering, with a dedicated general-purpose processor (or digital signal processor) in combination with a dedicated memory that is statically configured with appropriate filter coefficients.

SUMMARY

According to an embodiment, a system comprises a system interface to receive one or more instruction sets from a microcontroller and to receive digital data to be processed. The system further comprises a controller that is reconfigurable according to the instruction sets received by the system interface. The system further comprises a data path device to perform digital filtering operations on the digital data as directed by the controller according to the reconfiguration of the controller by the instruction sets.

According to an embodiment, a method comprises populating a controller with data path instructions and populating a data path device with one or more filter coefficients, receiving digital data to be digitally processed according to the data path instructions in the controller and the filter coefficients in the data path device, locating one or more data path instructions in the controller responsive to receiving the digital data, wherein the data path instructions are configured to identify one or more filter coefficients in the data path device, and performing signal processing operations on at least some of the digital data according to the data path instructions and the identified filter coefficients.

According to an embodiment, an apparatus comprises a control state machine capable of population with control store addresses according to instruction data received by a bus interface. The apparatus further comprises a control store memory accessible by the control state machine, the control store memory capable of population with data path instructions indexable by one or more of the control store addresses. The apparatus further comprises a data path device to perform digital signal processing operations on digital data according to the data path instructions.

DESCRIPTION OF THE DRAWINGS

The disclosure may be best understood by reading the detailed description with reference to the drawings.

DETAILED DESCRIPTION

A programmable system on a chip (PSOC) or other electronic devices may include analog devices, digital devices, a microcontroller, and a digital filtering system that can be dynamically reconfigured to implement various digital signal processing algorithms on digital signals. This ability to dynamically reconfigure the digital filtering system can allow the programmable system on a chip to implement many digital signal processing techniques, while allowing system designers the ability to efficiently utilize system resources, such as memory, analog-to-digital converters (ADCs), digital-to-analog converters (DACs), and other digital operations. Embodiments are shown and described below in greater detail.

Figure 1:
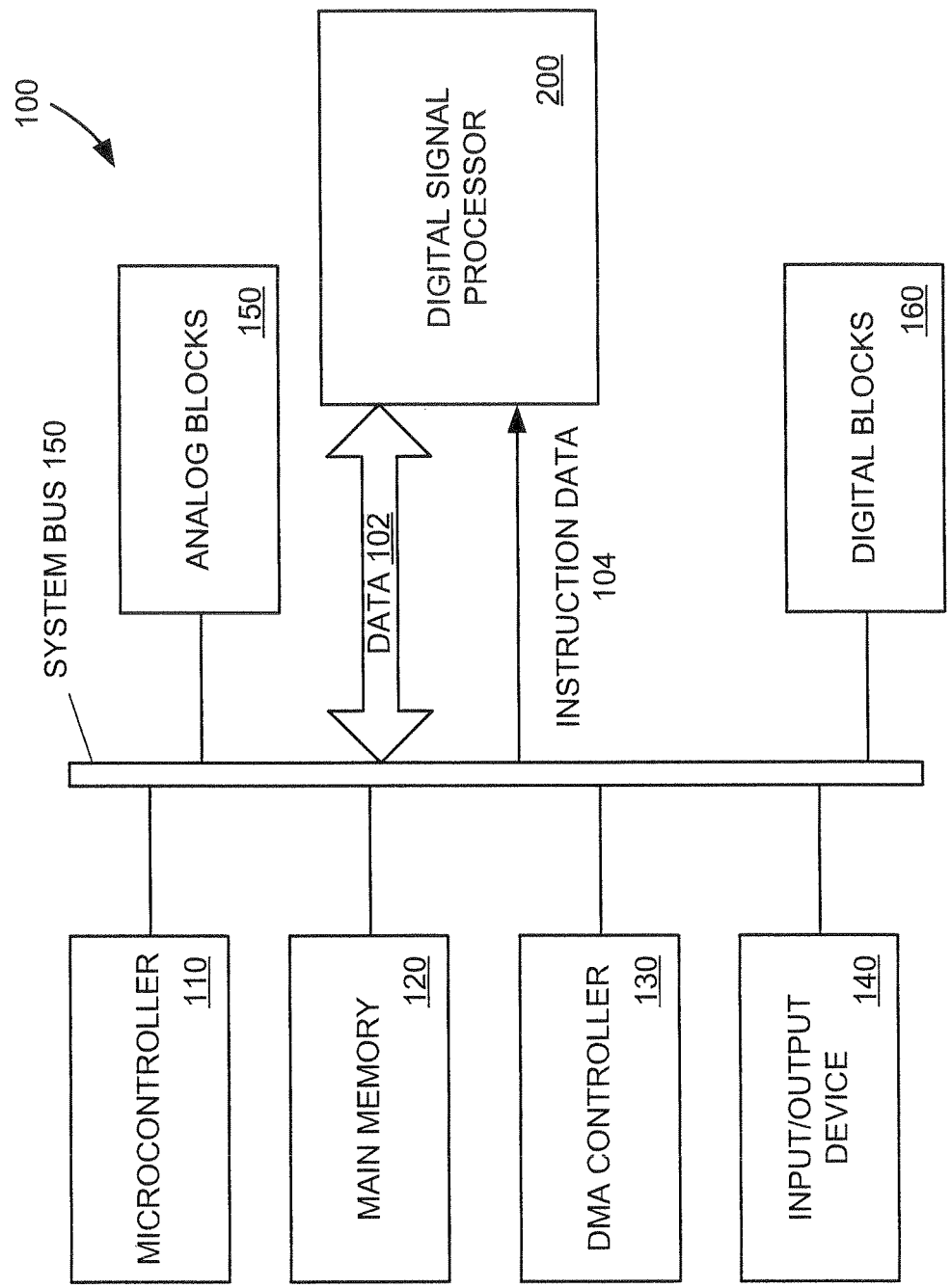
FIG. 1 is a block diagram of an example programmable mixed-signal system on a chip including a digital filtering system according to embodiments of the invention.

FIG. 1 is a block diagram of an example programmable system on a chip 100 including a digital signal processor 200 according to embodiments of the invention. Referring to FIG. 1, the programmable system on a chip 100 can be a mixed-signal system comprising a system bus 150 that communicatively couples multiple electronic components (both analog and digital), such as a microcontroller 210, a main memory 120, direct memory access (DMA) controller 130, Input Output (I/O) device 140, one or more analog blocks 150, such as analog-to-digital converters (ADCs) and digital-to-analog converters (DACs), one or more digital blocks 160, and a digital signal processor 200. In some embodiments, additional electronic components can be coupled to the system bus 150 and/or some of the electronic components shown in FIG. 1 can disconnected from the system bus 150.

The digital signal processor 200 is reconfigurable to implement various digital signal processing algorithms, such as a Finite Impulse Response (FIR) filter, a Biquad Infinite Impulse Response (IIR) filter, Lattice Wave Digital (LWDF) filter, among others. The digital signal processor 200 includes a system interface to communicate with the other blocks in the programmable system 100 and to receive algorithm or instruction data 104 in the form of instructions from the system bus 150. The digital signal processor 200 can execute the instructions to implement one or more digital signal processing algorithms or processes. For instance, the instructions data 104 can include various coefficients and instructions that, when loaded and initialized into the digital signal processor 200, can prompt the digital signal processor 200 to implement different digital signal processing algorithms or processes, such as a digital filter for data 102. In some embodiments, the instruction data 104 can be stored in the main memory 120 and the microcontroller 110 can provide the instruction data 104 to the digital signal processor 200.

In other words, the digital signal processor 200 can receive a series of instructions implementing a digital signal processing operation, such as a digital filter for received data 102. This series of instructions can be programmed or loaded once and later reconfigured by a microcontroller 110. The reconfigurability of the digital signal processor 200 allows the programmable system on a chip 100 the ability to maintain a wide array of digital signal processing functionality without the corresponding consumption of system resources, such as memory and processing. The architecture of the digital signal processor 200 can include multiple memory devices that are scalable, allowing for a compact implementation that is amenable to integration in one or more processors on the chip. Embodiments of the digital signal processor 200 will be described below in greater detail.

The digital signal processor 200 can receive data 102 from the system bus 150 and then apply an algorithm to data 102 according to its current configuration. There are many ways for the programmable system on a chip 100 to provide or stream the data 102 to the digital signal processor 200. For instance, the main system processor 110 can access the data 102 stored in the main memory 120 and send or stream it to the digital signal processor 200. In another example, the DMA controller 130 can directly retrieve and provide or stream the data 102 from one or more of the electrical components coupled to the system bus 105.

The I/O device 140 can receive analog or digital signals, for example, from a microphone or a network, and provide them to the main memory 120 or other storage device in the programmable system on a chip 100. In some embodiments, the I/O device 140 can provide received analog signals to an analog-to-digital converter (not shown) to convert the analog signals into digital signals for subsequent digital filtering. The DMA controller 130 can directly transfer these converted digital signals to the digital signal processor 200 as data 102 for digital filtering.

Figure 2:
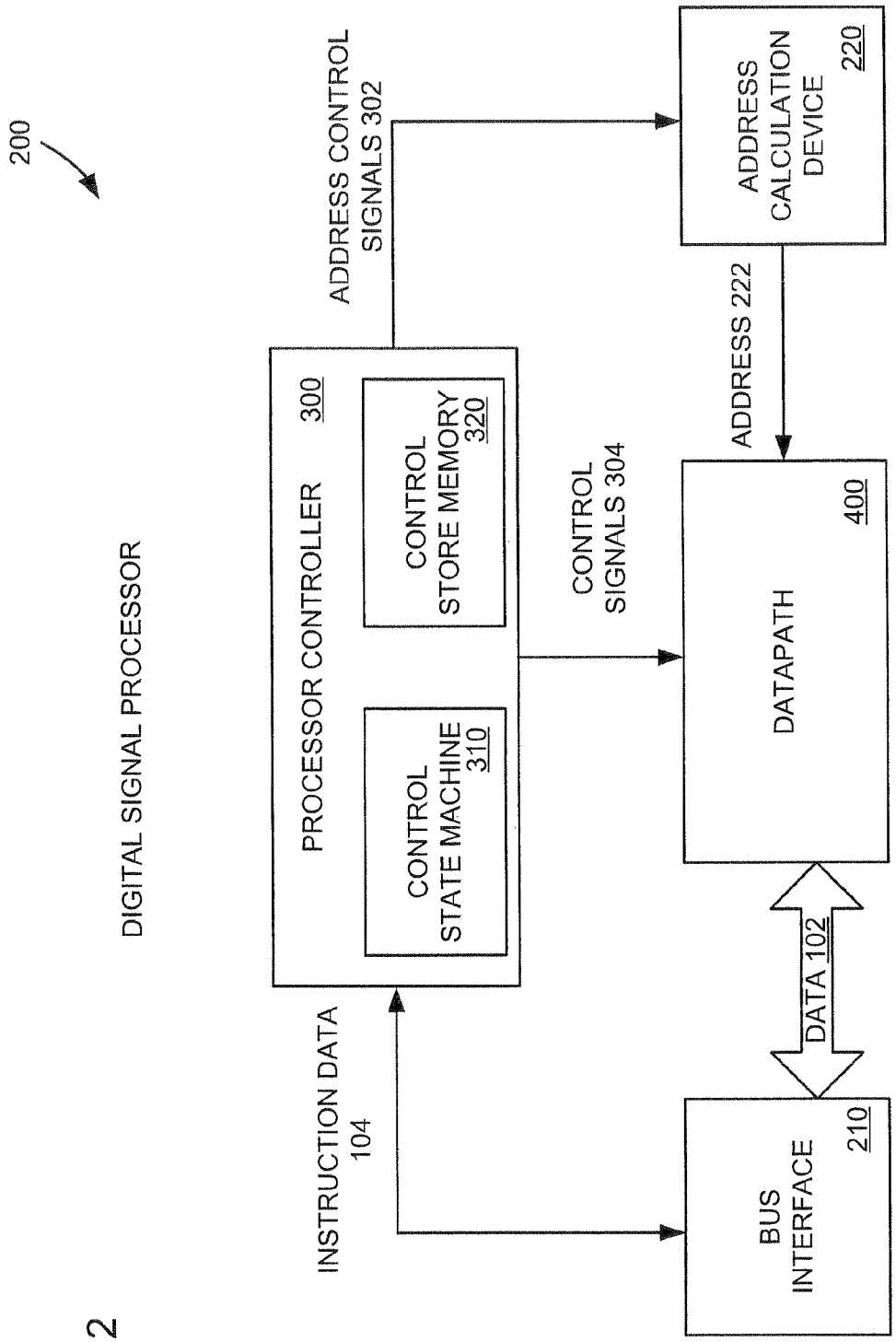
FIG. 2 is a block diagram illustrating example embodiments of the digital signal processor shown in FIG. 1.

FIG. 2 is a block diagram illustrating example embodiments of the digital signal processor 200 shown in FIG. 1. Referring to FIG. 2, the digital signal processor 200 includes a bus interface 210 to exchange data with the system bus 150 of the programmable system on a chip 100. The digital signal processor 200 also includes a data path 400 to perform mathematical operations on the data 102 received by the bus interface 210, and includes a processor controller 300 to control or direct the operations of the data path 400.

The processor controller 300 and the data path 400 can be loaded or configured to, at least in part, implement one or more digital signal processing algorithms according to the instruction data 104. In some embodiments, the data path 400 can load various coefficients used in implementing specific digital filters from the instruction data 104, while the processor controller 300 can load various data path instructions that both direct configuration of the data path 400 and identify which coefficients the data path 400 is to utilize during the signal processing operations.

The processor controller 300 can be implemented as a hierarchical controller that allows complex branching to be implemented. Rather than using long sequential instruction sets, the data path instructions can be grouped in loops, subroutines, or multi-way branches in control flow. This hierarchical structure can enable the digital signal processor 200 to incorporate reduced-size memory devices to store the groups of data path instructions, thus allowing for a smaller overall implementation of the digital signal processor 200. For example, an Infinite Impulse Response (IIR) filter can be implemented using a basic building block called a biquad. The above architectural features enable scalability of the digital signal processor 200, and allow one or more processors to be integrated on a single die with analog and digital circuit blocks to comprise a mixed signal PSoC device.

The processor controller 300 can provide control signals 304 to the data path 400 and one or more address calculation devices 220 according to the instructions loaded in the processor controller 300. The control signals 304 prompt the data path 400 and address calculation devices 220 to implement at least one digital signal processing algorithm or process. In some embodiments, the control signals 304 direct the flow of the data 102 through the data path 400, e.g., by establishing which mathematical and/or logical functions are utilized to manipulate the data 102 during digital signal processing and what signals or data 102 is inputted into the selected mathematical and/or logical functions. When the data 102 is received with a fixed width, the digital signal processor 200 can be a fixed word length processor. Thus, when using a binary point, floating point arithmetic can be emulated by the digital signal processor 200.

The processor controller 300 can also provide address control signals 302 to address calculation devices 220 according to the data path instructions. The address control signals 302 can identify one or more addresses 222 stored in the address calculation devices 220. The addresses 222, when provided to the data path 400, can identify coefficients that the data path 400 can use when digitally filtering the data 102 from the bus interface 210. The combination of the control signals 304 and the address control signals 302 can control the operation of the data path 400 to implement various digital signal processing algorithms and to digitally filter the data 102 from the bus interface 210.

In some embodiments, the data path 400 and address calculation device 220 can be pipelined in a fashion to allow calculation of consecutive multiply accumulate operations. The interaction with the processor controller 300, the address calculation device 220, and the data path 400 can allow branches in the program flow to occur. In some embodiments, the processor controller 220 can allow branching with pipeline latencies of 0, 1, and 2 cycles depending on the branch condition.

The processor controller 300 includes a control state machine 310 and a control store memory 320 that, in combination, can control or direct the operations of the data path 400. The control store memory 320 can be loaded with one or more data path instructions that, when identified by the control state machine 310, can prompt the processor controller 300 to output the control signals 304 and the address control signals 302. Embodiments of the processor controller 300 will be described below in greater detail.

Figure 3:
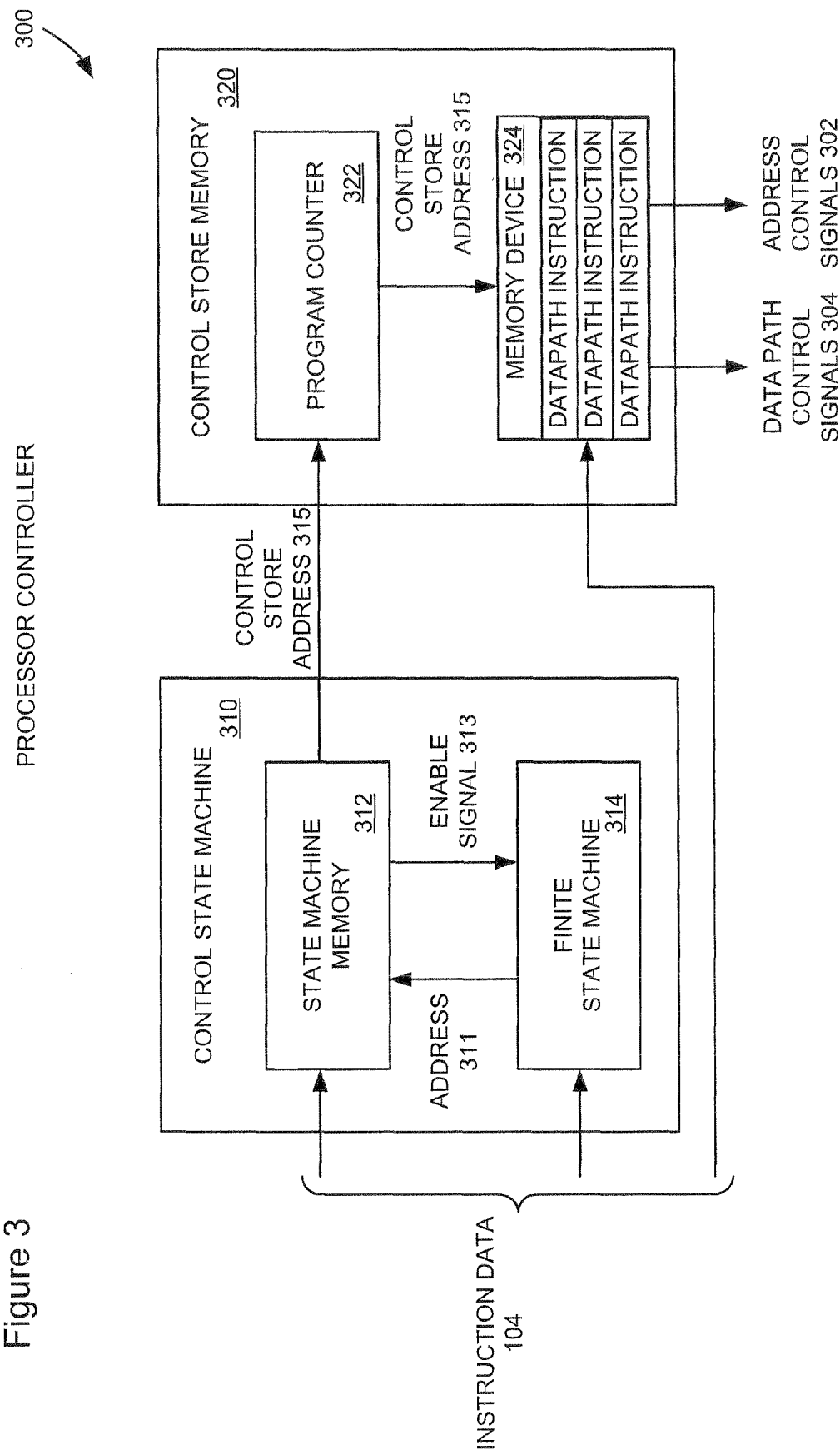
FIG. 3 is a block diagram illustrating example embodiments of a processor controller shown in FIG. 2.

FIG. 3 is a block diagram illustrating example embodiments of the processor controller 300 shown in FIG. 2. Referring to FIG. 3, the processor controller 300 can receive instruction data 104 from the bus interface 210 and reconfigure both the control state machine 310 and the control store memory 320 for various digital signal processing operations.

The control store memory 320 can include a memory device 324 to store data path instructions included in the instructions data 104. In some embodiments, the memory device 324 is addressed or is indexable by control store addresses 315 provided to the control store memory 320 by the control state machine 310. In some embodiments, the memory device 324 is a random access memory (RAM). The data path instructions, once identified responsive to the control store addresses 315, prompt the control store memory 320 to provide control signals 304 to the data path 400 and provide address control signals 302 to the address calculation devices 220.

The control store memory 320 can include a program counter 322 to receive the control store addresses 315 from the control state machine 310 and utilize them to identify data path instructions stored in the control store memory 324. In some embodiments, the control store address 315 can identify a starting point of a block of data path instructions to be sequentially executed until an end of block (eob) is reached. Although FIG. 3 shows the memory device 324 as a monolithic memory, in some embodiments, the memory device 324 can be bifurcated or otherwise divided into multiple memory blocks to help enable multi-way control flow jumping based on conditions from the data path 400 or address calculation devices 220. Additional program counters 322 can be provided to accommodate this division of the memory device 324, so that each portion of the memory device 324 has at least one associated program counter.

The control state machine 310 can include a state machine memory 312 and a finite state machine 314 that can be programmed with instruction data 104. For instance, the instruction data 104 can provide the finite state machine with addresses 311 and can populate the state machine memory 312 with control store addresses 315. In some embodiments, a random access memory (RAM) is used to implement both the state machine memory 312 and finite state machine 314. The use of RAM allows the control state machine 310 to be reconfigurable or reprogrammable, for example, by the microcontroller 110.

The finite state machine 314, when initiating a next state of a process, can provide one or more addresses 311 to the state machine memory 312. The addresses 311 can be used to index or address the state machine memory 312 and identify one or more control store addresses 315. Once identified, the state machine memory 312 can provide the control store addresses 315 to the program counter 322 of the control store memory 320 for use in identifying data path instructions in the memory device 324.

The finite state machine 314 can also receive input from various sources in the digital signal processor 200, and utilize the input to direct its operation. For instance, the state machine memory 312 can provide the finite state machine 314 with additional information, such as enable bits or signals 313, which can help determine the next state to perform. In some embodiments, the finite state machine 314 can proceed to another state of digital filtering process upon receipt of an end of block (eob) signal (not shown) provided by the control store memory 320, the data path 400, or other device in the digital signal processor 200.

Figure 4:
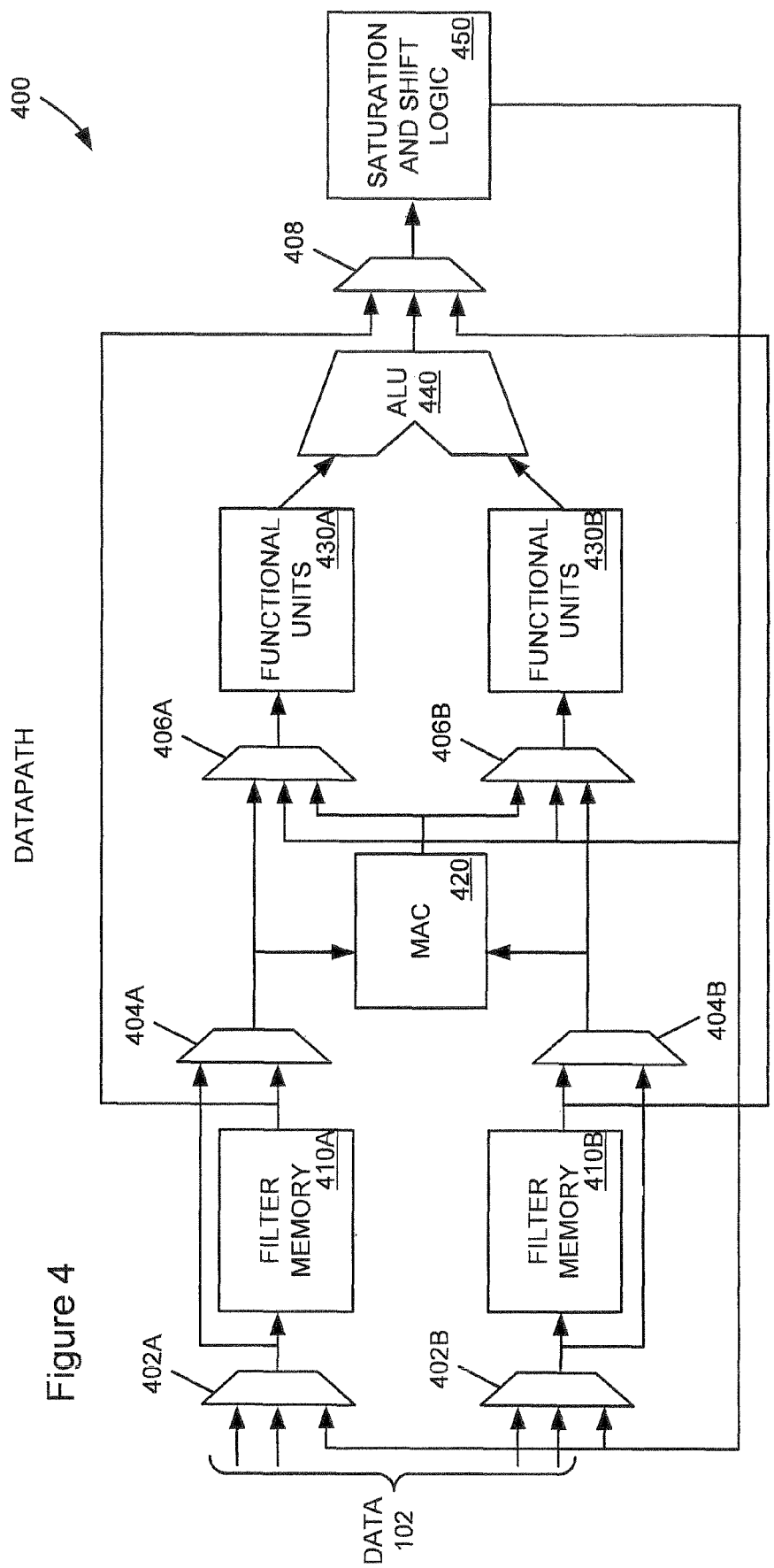
FIG. 4 is a block diagram illustrating example embodiments of a data path device shown in FIG. 2.

FIG. 4 is a block diagram illustrating example embodiments of the data path device shown in FIG. 2. Referring to FIG. 4, the data path 400 includes arithmetic and functional components that can manipulate received digital data 102 and implement a various digital signal processing operations.

The data path 400 includes a memory 410A and 410B to store coefficients and other sample data that can be accessed according to the addresses 222 from the address calculation devices 220. In some embodiments, there is at least one address calculation device memory per memory 410A and 410B in the data path 400. In some embodiments, the memory 410A and 410B can be populated according to the filter reconfiguration data 104 received at the bus interface 210. In some embodiments, memory 410A and 410B can be a random access memory (RAM). The use of RAM allows the data path 400 to be reconfigurable or reprogrammable, for example, by the microcontroller 110.

The data path 400 includes a multiply and accumulate unit (MAC) 420 that can multiply a plurality of operands, and accumulate the result. The MAC 420 can be configured to perform various multiplication functions according to the control signals 304 from the processor controller 300.

The data path 400 includes functional units 430A and 430B and an arithmetic logic unit (ALU) 440 to perform various mathematical or logical functions on operands. For instance, the functional units 430A and 430B can set the operand to 0 or 1, determine the absolute value of the operand and then optionally negate it, or just pass the operand or its negation to a next stage of the data path. The data path 400 can also include saturation and shift logic 450 to detect saturation of a result and to perform shift operations on the result.

The data path 400 includes a plurality of mulitplexers 402A-B, 404A-B, 406A-B, and 408, positioned between the various functional components. The addition of the multiplexers allows the data path 400 the flexibility to select between multiple inputs for each functional component and to determine the flow of the data through the data path 400. In other words, the data path 400 can implement many different digital filters by controlling the multiplexers 402A-B, 404A-B, 406A-B, and 408 with the control signals 304.

Figure 5:
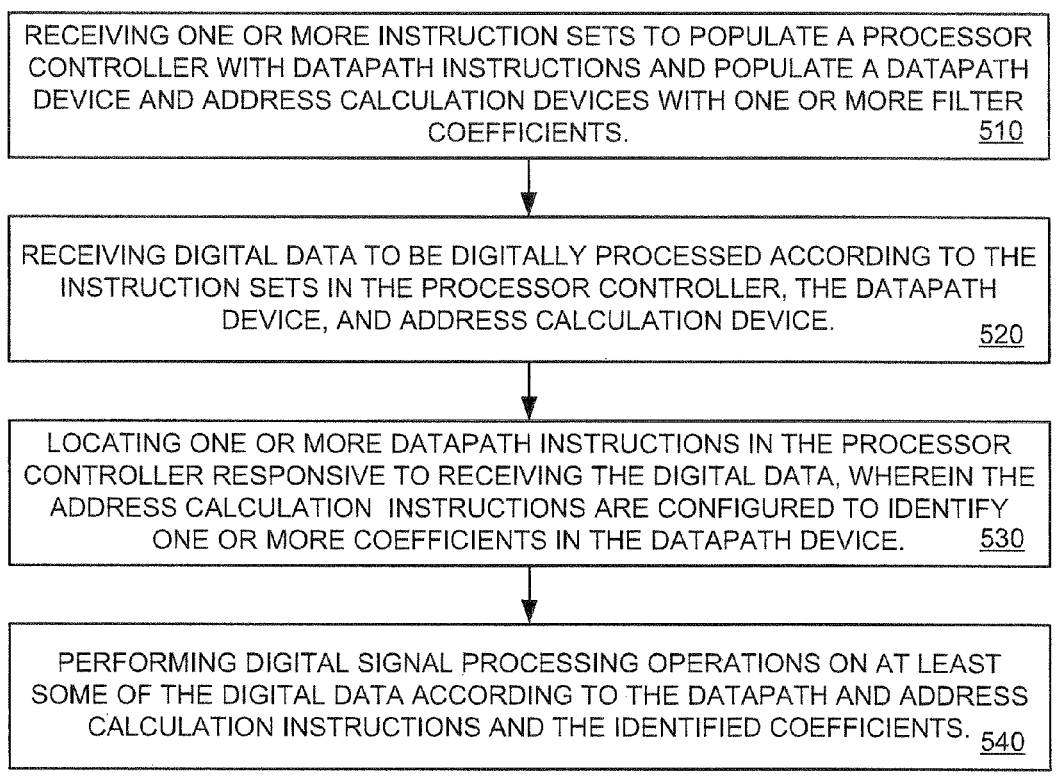
FIG. 5 is an example flowchart for the operation of the digital signal processor shown in FIGS. 1-4.

FIG. 5 is an example flowchart for the operation of the digital filtering system shown in FIGS. 1-4. Referring to FIG. 5, at a block 510, the digital signal processor 200 receives one or more sets of instruction data 104 to populate a digital processor controller 300 with data path instructions and populate a data path device 400 with one or more coefficients. The instructions data 104 can be received by a bus interface 210 and subsequently distributed to the processor controller 300 and the data path device 400. In some embodiments, the instruction data 104 can also populate an address calculation device 220 with addresses 222 that can identify the coefficients stored by the data path device 400.

At a block 520, the digital signal processor 200 receives digital data 102 to be digitally processed according to the instruction sets in the processor controller 300, the data path device 400, and address calculation device. The instruction data 104 can be received by a bus interface 210 and subsequently passed or streamed to the data path device 400 for digital filtering.

At blocks 530 and 540, the digital signal processor 200 locates one or more data path instructions in the processor controller 300 responsive to the receiving of the digital data 102, wherein the data path instructions are configured to identify one or more filter coefficients in the data path device 400. The digital signal processor 200 performs digital signal processing operations on at least some of the digital data 102 according to the data path and address calculation instructions and the identified coefficients.

As discussed above in greater detail, the digital processor controller 300 can directly configure the data path device 400 with control signals 304 responsive to the data path instructions, and can initiate the process for locating coefficients stored in the data path device 400 by providing address control signals 302 to the address calculation devices 220. Once the data path device 400 is configured according to the control signals 304 and the coefficients are identified according to the address control signals 302, the data path device 400 can implement at least a portion of a digital filtering algorithm or process and digitally filter the received digital data 102.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

The invention claimed is:

1. A system comprising:
a controller includes a control state machine configured to store control store addresses, and includes a control store memory configured to store data path instructions, wherein the controller is configured to identify one of the control store addresses stored in the control state machine and select one of the data path instructions stored in the control store memory with the identified control store address;
an address calculation device configured to store coefficient addresses and to select one of the coefficient addresses in response to a first portion of the selected data path instruction received from the control store memory; and
a data path device configured to identify a location of at least one filter coefficient stored by the data path device in response to the selected coefficient address received from the address calculation device, wherein the data path device is configured to perform digital filtering operations on digital data with the at least one filter coefficient in response to a second portion of the selected data path instruction received from the control store memory.

2. The system of claim 1, wherein the second portion of the selected data path instruction is configured to direct the data path device to perform the digital filtering operations on the digital data.

3. The system of claim 1, wherein the second portion of the selected data path instruction is configured to prompt the control store memory to issue one or more control signals that direct the data path device to perform specific digital filtering operation on the digital data.

4. The system of claim 1, wherein the first portion of the selected data path instruction is configured to prompt the control store memory to issue one or more address control signals to identify one or more filter coefficients for the data path device to utilize when performing digital processing operations on the digital data.

5. The system of claim 1, wherein the data path device includes a filter memory to store the filter coefficients for use during digital filtering operations on the digital data.

6. The system of claim 1, further comprising
a system interface to receive one or more instruction sets from a microcontroller and to receive digital data, wherein the control state machine is configured to store control store addresses from the one or more instruction sets received by the system interface, wherein the address calculation device is accessible by the controller, and wherein the addresses stored by the address calculation device are indexable by the first portion of the data path instructions stored in the controller.

7. The system of claim 1, wherein the control store memory is accessible by the control state machine, the data path instructions stored in the control store memory are indexable by one or more of the control store addresses stored by the control state machine.

8. A method comprising:
receiving, with a controller, control store addresses and data path instructions in instruction sets;
selecting, with the controller, at least one of the control store addresses based, at least in part, on a configuration of the controller;
identifying, with the controller, one of the data path instructions according to the selected control store address; and
providing, with the controller, a first portion of the identified data path instruction to an address calculation device storing filter addresses, wherein the address calculation device is configured to select one of the filer addresses with the first portion of the identified data path instruction; and
providing, with the controller, a second portion of the identified data path instruction to a data path device, wherein the data path device is configured to perform signal processing operations on digital data with at least one filter coefficient located in the data path device by the selected filter address from the address calculation device and in response to the second portion of the identified data path instruction received from the controller.

9. The method of claim 8, wherein the second portion of the identified data path instruction includes an instruction capable of directing the data path device to perform digital filtering operations on the digital data.

10. The method of claim 8, wherein the first portion of the identified data path includes at least one address control signal to identify one or more filter coefficients for the data path device to utilize when performing digital filtering operations on the digital data.

11. The method of claim 8, further comprising:
populating the controller with the control store addresses and the data path instructions;
populating the data path device with the one or more filter coefficients; and
populating the address calculation device with the at least one address.

12. An apparatus comprising:
a control state machine capable of population with control store addresses according to instruction data received by a bus interface;
a control store memory accessible by the control state machine, the control store memory capable of population with data path instructions indexable by one or more of the control store addresses, wherein the control state machine is configured to identify one of the control store addresses stored and select one of the data path instructions stored in the control store memory with the identified control store address;
an address calculation device configured to store coefficient addresses and to select one of the coefficient addresses in response to a first portion of the selected data path instruction received from the control store memory; and
a data path device configured to identify a location of at least one filter coefficient stored by the data path device in response to the selected coefficient address received from the address calculation device, wherein the data path device is configured to perform digital signal processing operations on digital data with the at least one filter coefficient according to a second portion of the selected data path instruction received from the control store memory.

13. The apparatus of claim 12, wherein the second portion of the selected data path instruction includes one or more control signals capable of configuring the data path device to perform digital filtering operations on the digital data.

14. The apparatus of claim 12, wherein the first portion of the selected data path instruction includes at least one address control signal to identify one or more filter coefficients for the data path device to utilize when performing digital signal processing operations on the digital data.

15. The apparatus of claim 12, wherein the data path device includes a memory to store filter coefficients included in the instructions for use during digital signal processing operations on the digital data.

16. The apparatus of claim 15, wherein the address calculation device is capable of population with one or more coefficient addresses indexable by first portions of the data path instructions from the control store memory, wherein the data path device is configured to identify one or more of the filter coefficients for use during digital signal processing operations on the digital data according to the coefficient addresses from the address calculation device.

17. The apparatus of claim 12, wherein the control state machine is configured to provide at least one of the control store addresses to the control store memory, and wherein the at least one of the control store address is configured to indicate an initial location for a sequential execution of a contiguous set of data path instructions.

18. The apparatus of claim 12, wherein the control state machine further comprises:
- a state machine memory to store the control store addresses; and
- a finite state machine to store one or more addresses that identify a location of the control store addresses, wherein the state machine memory is configured to receive at least one of the addresses from the finite state machine and locate a corresponding control store address to provide to the control store memory.

* * * * *